United States Patent
Isimaru

(10) Patent No.: US 7,123,108 B2
(45) Date of Patent: Oct. 17, 2006

(54) SURFACE MOUNT CRYSTAL OSCILLATOR

(75) Inventor: Chisato Isimaru, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/926,794

(22) Filed: Aug. 26, 2004

(65) Prior Publication Data
US 2006/0055478 A1 Mar. 16, 2006

(51) Int. Cl.
H03B 1/00 (2006.01)
(52) U.S. Cl. .................... 331/68; 331/158; 310/348
(58) Field of Classification Search .............. 331/68, 331/158; 310/348
See application file for complete search history.

(56) References Cited

U.S. PATENT DOCUMENTS 4,639,631 A * 1/1987 Chason et al. .............. 310/344
5,949,294 A * 9/1999 Kondo et al. ................ 331/68
6,720,837 B1 * 4/2004 Moriya et al. .............. 331/158
6,946,922 B1 * 9/2005 Takemura et al. ......... 331/108 D
2001/0033202 A1 * 10/2001 Oda ............................ 331/68

FOREIGN PATENT DOCUMENTS

JP 05-65110 U 8/1983

* cited by examiner

Primary Examiner—Joseph Chang
(74) Attorney, Agent, or Firm—Katten Muchin Rosenman LLP

(57) ABSTRACT

A surface mount quartz crystal oscillator has a package body having a bottom wall and a first frame wall laminated on the bottom wall and having a central opening, a quartz crystal blank accommodated in a recess formed in the package body including the central opening, an IC (integrated circuit) chip accommodated in the recess and having at least an oscillator circuit connected to the crystal blank, and a cover for enclosing the recess to hermetically encapsulating the crystal blank and the IC chip within the recess. The first frame wall has a notch portion partially cut into the outer periphery thereof, such that a terminal formed on a portion of the top of the bottom wall exposes in the notch portion. The exposed terminal is, for example, a testing crystal terminal electrically connected to the crystal blank.

11 Claims, 4 Drawing Sheets

SURFACE MOUNT CRYSTAL OSCILLATOR

BACKGROUND OF THE INVENTION

1. Field of the Invention

The present invention relates to a surface mount quartz crystal oscillator, and more particularly, to a surface mount crystal oscillator which has terminals for testing disposed on an outer surface thereof.

2. Description of the Related Art

A surface mount crystal oscillator which accommodates a quartz crystal unit and an oscillator circuit using the crystal unit in a surface mount package has been widely used, particularly for portable electronic devices as a frequency or a time reference source because of its small size and light weight. In recent years, an increasing reduction in size has been rapidly advanced in a variety of portable devices represented by portable telephones, causing an associated reduction in size in surface mount crystal oscillators. For example, crystal oscillators having the external dimensions of 5 mm×3.2 mm, and 3.2 mm×2.5 mm are currently available on the market, and an announcement has been made on the development of a crystal oscillator having the external dimensions of 2.5 mm×2 mm. However, with an increasing reduction in size, several disadvantages arise in surface mount crystal oscillators. One of such disadvantages is a problem of terminals provided on an outer surface of the crystal oscillator for purposes of testing or adjustments.

A crystal oscillator is provided with a power supply terminal, a ground terminal, and an output terminal for use in a normal operation, and is also provided with terminals for use in testing and adjustments which may be made during manufacturing or at the time of shipment. The terminals for testing or adjustments are typically disposed on an outer side surface of a surface mount crystal oscillator. Japanese Utility Model Laid-open application No. 5-65110 (JP, 5-65110, U), for example, discloses a crystal oscillator which has terminals directly connected to a quartz crystal blank as testing terminals. However, an increasing reduction in size of the crystal oscillator has imposed more limitations in disposing the terminals for testing or adjustments.

FIG. 1A is a partially cut-away front view illustrating a conventional surface mount crystal oscillator. FIGS. 1B and 1C are plan views of the crystal oscillator illustrated in FIG. 1A when a cover has been removed from the crystal oscillator, and when the cover is put on the crystal oscillator, respectively.

The surface mount crystal oscillator employs a package body 1 formed with a recess which receives IC (integrated circuit) chip 2 and quartz crystal blank 3, and cover 4 which is placed over the recess for closing the same to hermetically encapsulate IC chip 2 and crystal blank 3 within package body 1. Package body 1, which is made of laminated ceramics, is comprised of bottom wall 5 and first frame wall 6 laminated on bottom wall 5. Bottom wall 5 is comprised of flat plate 7 and second frame wall 8 laminated on flat plate 7. Flat plate 7, first frame wall 6, and second frame wall 8 correspond to respective ceramic green sheets, where first frame wall 6 is formed with a central opening extending therethrough substantially in the shape of rectangle, and second frame wall 8 is formed with a central opening extending therethrough substantially in the shape of rectangle smaller than the central opening of first frame wall 6. By thus designing bottom wall 5 and first frame wall 6, a step is formed in the recess of package body 1.

At positions on the top of flat plate 7 corresponding to the bottom of package body 1, IC terminals, not shown, are formed for use in connection with IC chip 2. Also, at positions on the top of second frame wall 8 corresponding to the step in the recess of package body 1, crystal terminals 9 are formed for use in connection with crystal blank 3. Package body 1 is further formed with a conductor pattern, not shown, for connecting the IC terminals to crystal terminals 9.

IC chip 2, which comprises an integrated oscillator circuit including a temperature compensation function, is secured to the IC terminals on the bottom of the recess in package body 1, for example, by flip chip bonding. Crystal blank 3 is, substantially in the shape of rectangle and, for example, an AT-cut quartz crystal blank. Crystal blank 3 is provided with an excitation electrode, not shown, on each of main surfaces thereof, and extending electrodes (not shown) are extended from the excitation electrodes toward a pair of opposing sides. Then, crystal blank 3 is secured by conductive adhesive 21 to the step in the recess of package body 1, i.e., crystal terminals 9 formed on second frame wall 8 in outer peripheral regions of both sides of crystal blank 3 to which the extending electrodes are extended.

Cover 4, which is made of a metal, is bonded to a metal ring or a metal thick film, not shown, provided on the top of package body 1, i.e., the top of first frame wall 6 by seam welding, thereby enclosing the recess of package body 1 to hermetically encapsulate IC chip 2 and crystal blank 3 within the recess.

At four corners on the bottom of package body 1, i.e., at the four corners of the bottom of flat plate 4, mounting electrodes 20 are formed for use in surface-mounting the crystal oscillator on a wiring board. Mounting electrodes 20 thus formed also extend off outer side surfaces of package body 1. Mounting electrodes 20, which will serve as a power supply terminal, a ground terminal, an output terminal, and the like of the crystal oscillator, are connected to IC chip 2 through conductive paths and IC terminals, not shown.

In such a surface mount crystal oscillator, four write terminals 10a and a pair of testing crystal terminals 10b, for example, are provided on the outer side surfaces of second frame wall 8, for example, of package body 1 for use in adjustments and testing. Write terminals 10a are used for writing temperature compensation data for the temperature compensation mechanism within IC chip 2. The temperature compensation data is determined based on a change in oscillating frequency due to the temperature by measuring the oscillating frequency from the crystal oscillator which is operated while the ambient temperature is varied. By writing the temperature compensation data, the temperature compensation mechanism normally operates, thus permitting the crystal oscillator to function as a temperature compensated crystal oscillator (TCXO). Testing crystal terminals 10b are used for testing, for example, CI (crystal impedance) and resonance characteristic of the crystal unit (crystal blank 3) alone, for example, after it is encapsulated by cover 4.

These write terminals 10a and testing crystal terminal 10b are formed by extending the IC terminals and crystal terminals 9 from the laminated surface to the outer side surfaces of second frame wall 8, in other words, by the through-holes formed through the ceramic package. For writing data or making a measurement using write terminals 10a and testing crystal terminals 10b, a needle-shaped device or jig called "probe" is brought into contact with these terminals. For permitting the probe to appropriately come into contact with the terminals, vertically extending cavities are formed in first frame wall 6, second frame wall 8, and flat plate 7 at positions at which these terminals are formed, and the terminals are formed on the surfaces of the cavities in second frame wall 8.

However, with the increasing reduction in size of the crystal oscillator in the foregoing structure, a resulting reduced area of the outer side surface of the package makes it more and more difficult to form as many write terminals 10a and testing crystal terminals 10b as required on the side surface of package body 1. Also, since write terminals 10b, testing crystal terminals 10b, and mounting terminals 20 are in closer proximity to one another, solder can introduce around write terminals 10b and testing crystal terminals 10b, when the crystal oscillator is mounted on a wiring board by reflow soldering or the like, thus possibly causing malfunctions. Further, since through-holes are formed in the cavities cut into the side surfaces of package body 1 in order to form write terminals 10a and testing crystal terminals 10b, the side wall of package body 1 has locally smaller widths where the cavities are formed, resulting in a problem of partially lower mechanical strengths. As a result, during seal welding of cover 4, the through-holes can be damaged.

SUMMARY OF THE INVENTION

It is an object of the present invention to provide a crystal oscillator having terminals on an outer surface of a package body for testing or adjustments, which can be provided with a required number of terminals even if the crystal oscillator is increasingly reduced in size, and which exhibits an enhanced mechanical strength.

The object of the present invention is achieved by a crystal oscillator which has a package body having a bottom wall and a first frame wall laminated on the bottom wall and having a central opening, a crystal blank accommodated in a recess formed in the package body including the central opening, an IC (integrated circuit) chip accommodated in the recess and having at least an oscillator circuit connected to the crystal blank, and a cover for enclosing the recess to hermetically encapsulate the crystal blank and the IC chip within the recess, wherein a notch portion is partially cut into the outer periphery of the first frame wall, and a terminal formed on a portion of the top of the bottom wall is exposed in the notch portion. The exposed terminal is, for example, a testing crystal terminal electrically connected to the crystal blank.

According to the present invention, since the terminal is exposed by cutting away the first frame wall such that the terminal can be accessed from above, terminals disposed on the outer side surface of the package body can be reduced in number or eliminated to facilitate a further reduction in size of the crystal oscillator. Also, since a less number of terminals are formed on the outer side surface, through-holes can also be reduced in number to enhance the mechanical strength of the crystal unit.

DETAILED DESCRIPTION OF THE PREFERRED EMBODIMENTS

Figure 1A:
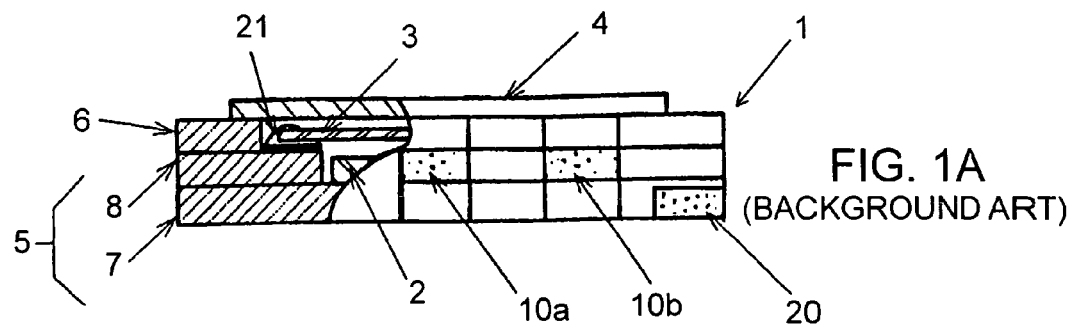
FIG. 1A is a partially cut-away front view illustrating a conventional surface mount crystal oscillator.
Figure 1B:
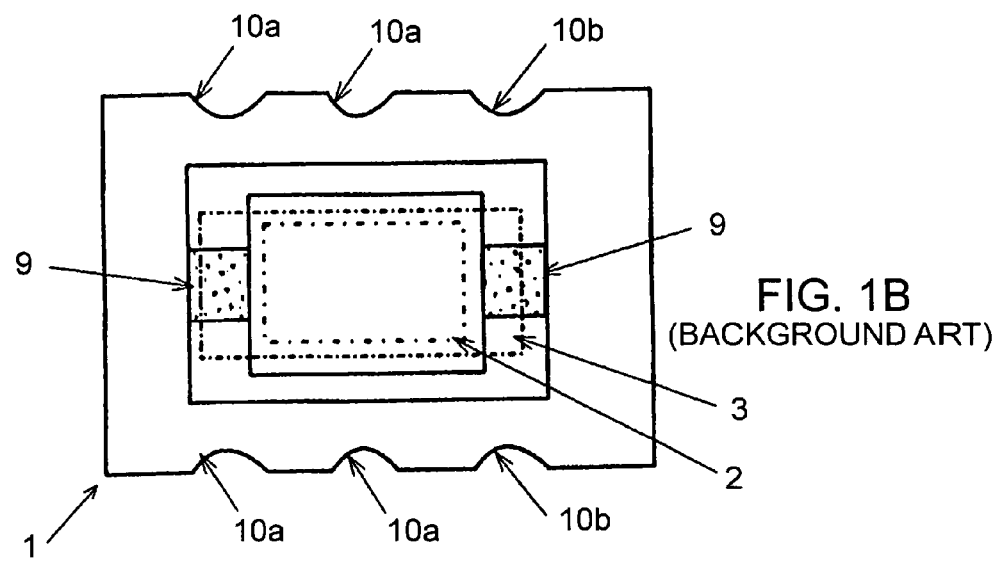
FIGS. 1B and 1C are plan views of the crystal oscillator illustrated in FIG. 1A when a cover is removed from and when the cover is put on the crystal oscillator illustrated in FIG. 1A, respectively.
Figure 1C:
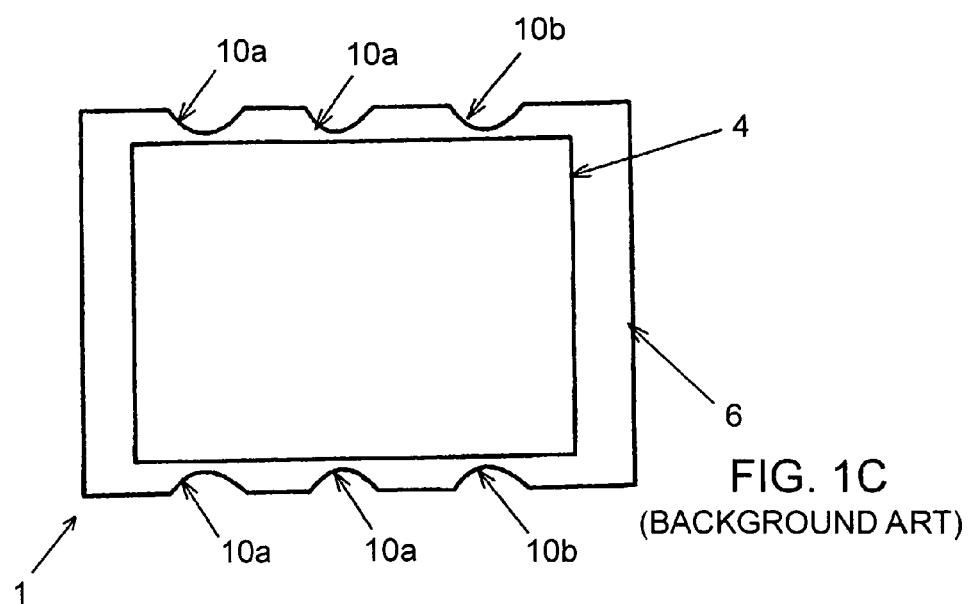
Figure 2A:
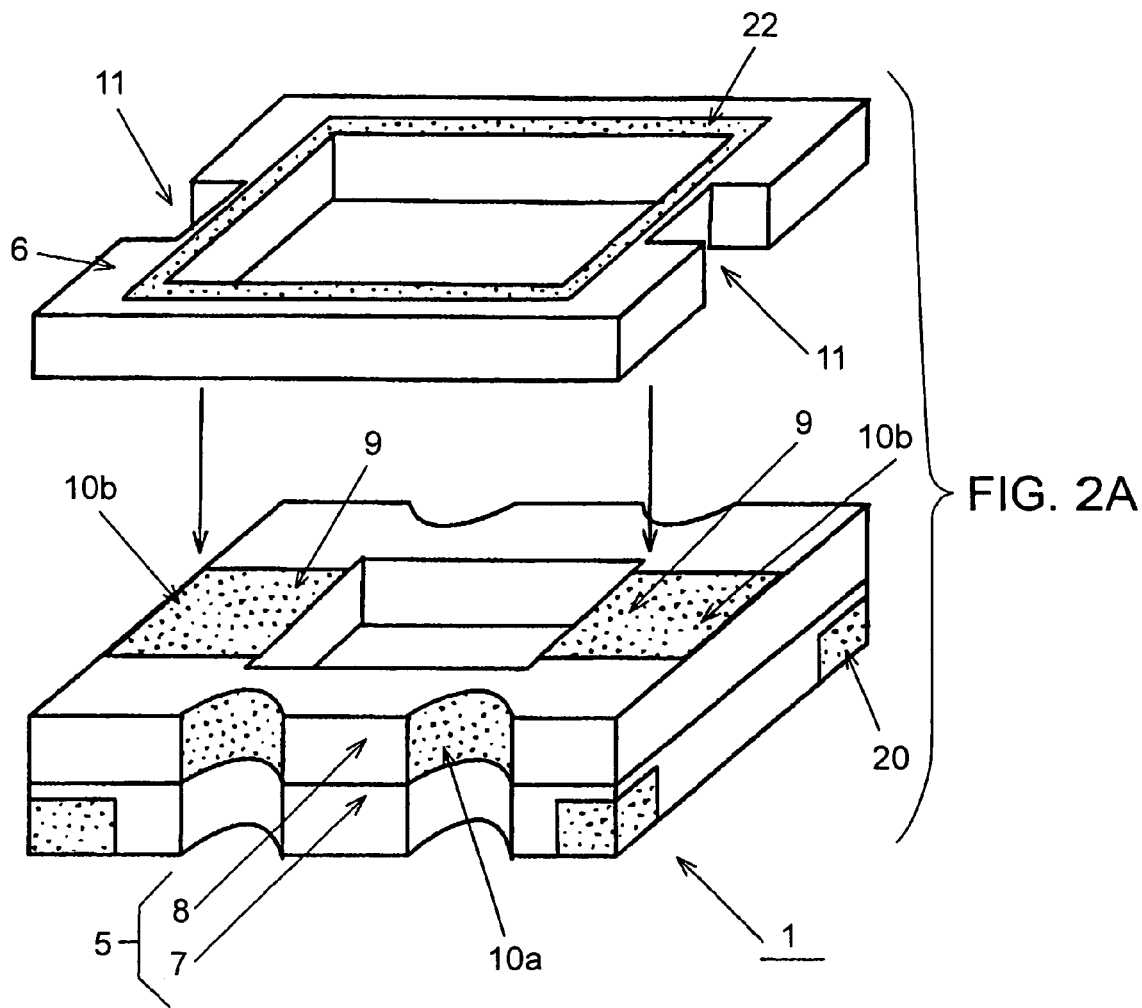
FIG. 2A is an exploded perspective view illustrating a surface mount crystal oscillator according to one embodiment of the present invention.
Figure 2B:
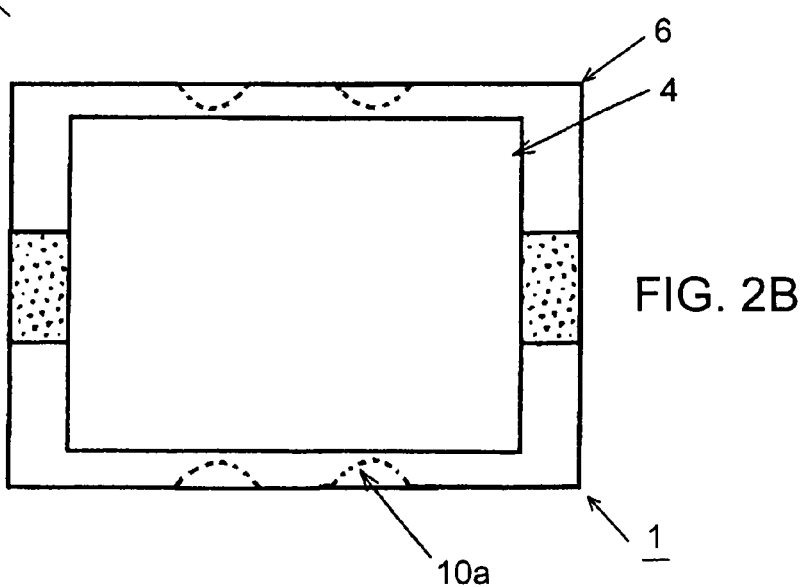
FIG. 2B is a plan view of the crystal oscillator illustrated in FIG. 2A.

In FIGS. 2A and 2B which illustrate a surface mount crystal oscillator according to one embodiment of the present invention, components identical to those in FIGS. 1A to 1C are designated the same reference numerals, so that repetitive descriptions are simplified or omitted in the following.

The surface mount quartz crystal oscillator according to one embodiment of the present invention comprises package body 1; IC chip 2 and quartz crystal blank 3, though not shown in FIG. 2A, accommodated in package body 1; and cover 4 bonded to package body 1 by seam welding to hermetically encapsulate IC chip 2 and crystal blank 3. Package body 1 is made of laminated ceramics having a structure in which first frame wall 6 is laminated on bottom wall 5 which has flat plate 7 and second frame wall 8 laminated thereon. While this crystal oscillator is also provided with mounting electrodes 20, write terminals 10a, and testing crystal terminals 10b on outer surfaces of package body 1, testing crystal terminals 10b are formed at positions different from the conventional crystal oscillator illustrated in FIGS. 1A to 1C.

In the crystal oscillator of the present embodiment, a pair of crystal terminals 9 formed on second frame wall 8 are led to the outer periphery of second frame wall 9. First frame wall 6 has its outer periphery partially cut away corresponding to led crystal terminals 9. Specifically, notch portions 11 are formed substantially at the center of side surfaces at both ends in the longitudinal direction of rectangular first frame wall 6. As a result, the top of second frame wall 8 exposes at positions of notch portions 11 in first frame wall 6. Since crystal terminals 9 are formed on the exposed surface, crystal terminals 9 eventually expose in upward orientation. Therefore, in this crystal oscillator, one pair of crystal terminals 9 exposed in upward orientation are used as testing crystal terminals 10b.

First frame wall 6 is formed with a metal ring and metal thick film 22 on the top thereof, excluding the width of notch portions 11. Then, as illustrated in FIG. 2B, metal cover 4 is bonded by seam welding to the top of first frame wall 6. Package body 1 (i.e., second frame wall 8) is provided with four write terminals 10a on outer side surfaces, in a manner similar to the conventional crystal oscillator.

Package body 1 made of laminate ceramics may be fabricated by providing green sheets corresponding to first frame wall 6, flat plate 7, and second frame wall 8, respectively, laminating these green sheets, and integrally firing them. Each of the green sheets has been previously provided with electrodes, terminals, and a conductor pattern corresponding to conductive paths which interconnect the electrodes and terminals.

In the foregoing structure, since testing crystal terminals 10b are disposed in an outer peripheral region on the top of second frame wall 8 such that testing crystal terminals 10b can be accessed from above, it is possible to reduce the number of terminals disposed on the outer side surfaces of package body 1 and therefore facilitate a reduction in size of the crystal oscillator. Also, the foregoing structure can have a less number of through-holes formed on the side surfaces and a less number of cavities formed in the side surfaces of bottom wall 5, so that resulting package body 1 can exhibit an enhanced mechanical strength.

While the write terminals are disposed two by two on the respective longer sides of package body 1, the write terminals may be disposed one by one on each side. From a viewpoint of enhancing the mechanical strength, the write terminals are preferably distributed to a larger number of sides.

While the foregoing description has been made in connection with a case in which the surface mount crystal oscillator is a temperature compensated crystal oscillator, a simple packaged crystal oscillator (SPXO) and a voltage controlled crystal oscillator (VCXO) do not need the write terminals disposed on the outer surfaces of package body 1, and therefore, according to the structure of this embodiment, can eliminate through-holes from the side surfaces of the package body to further enhance the mechanical strength and prevent damages during the seam welding and the like.

While the crystal oscillator illustrated in FIGS. 2A and 2B has testing crystal terminals 10b formed on both end sides in the longitudinal direction of package body 1, location of the formation of testing crystal terminals 10b exposed in upward orientation is not limited to such positions, but testing crystal terminals 10b can be formed at arbitrary positions on package body 1.

Figure 3A:
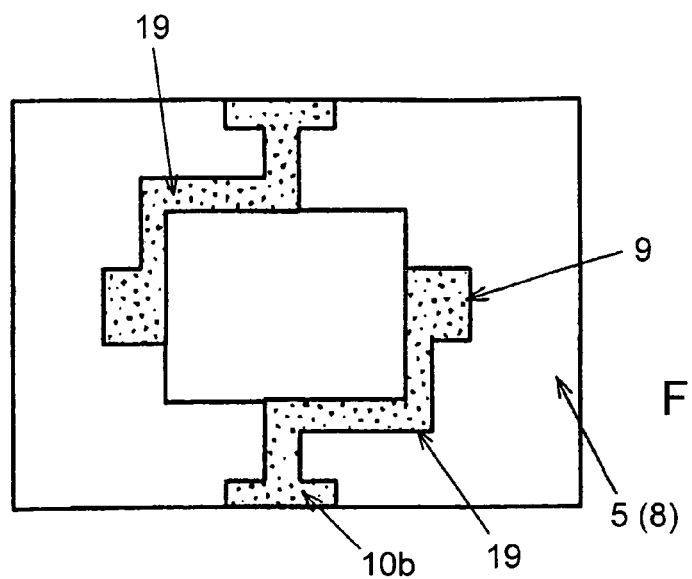
FIGS. 3A to 3C are a plan view illustrating a bottom wall, a plan view illustrating a frame wall, and a plan view illustrating a package body, respectively, in a surface mount crystal oscillator according to another embodiment of the present invention.
Figure 3B:
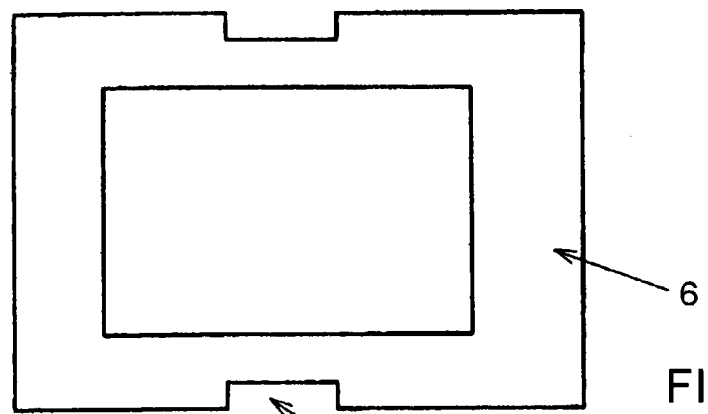
Figure 3C:
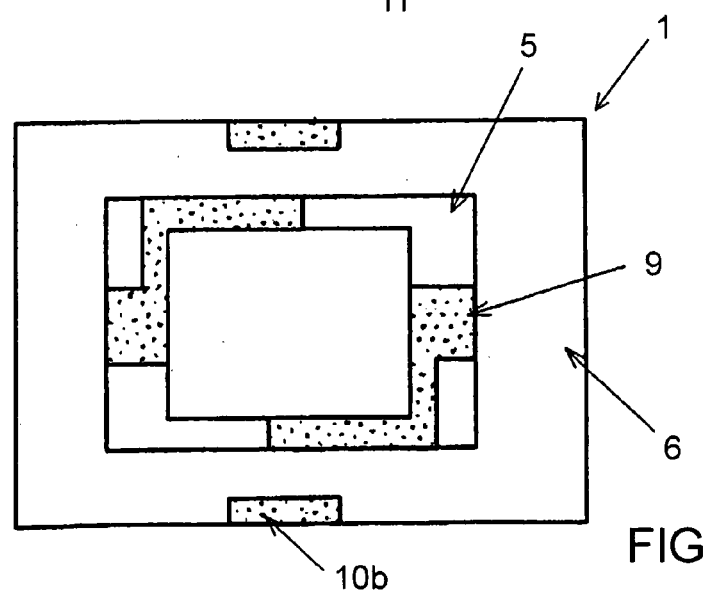

FIGS. 3A to 3C illustrate a crystal oscillator which comprises testing crystal terminals 10b disposed on both end sides of package body 1 in the width direction. Even such a crystal oscillator is formed, as shown in FIG. 3A, with a pair of crystal terminals 9 on both end sides in the longitudinal direction of a rectangular opening formed through second frame wall 8. Since testing crystal terminals 10b are positioned at both ends of second frame wall 8 in the width direction, conductive paths 19 are formed to border the edge of the opening on second frame wall 8 each for connecting crystal terminal 9 to testing crystal terminal 10b.

As illustrated in FIG. 3B, first frame wall 6 is formed with notch portions 11 positioned substantially at the center of the upper and lower sides, as shown, of first frame wall 6, respectively. FIG. 3C illustrates a top plan view of package body 1 comprised of such bottom wall 5 (i.e., flat plate 7 and second frame wall 8) and first frame wall 6. It should be noted that for sake of description, FIGS. 3B and 3C do not show the metal ring or metal thick film formed along the edge of the opening of first frame wall 6.

Figure 4:
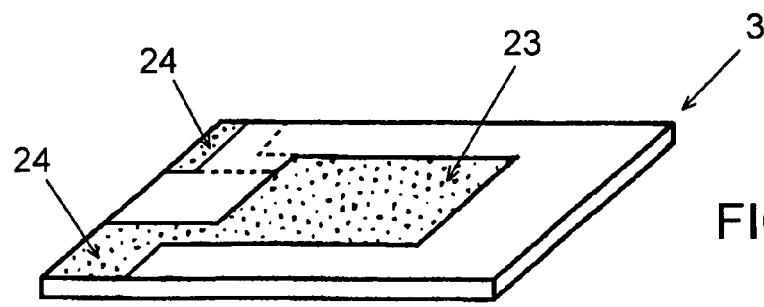
FIG. 4 is a perspective view of a crystal blank.
Figure 5:
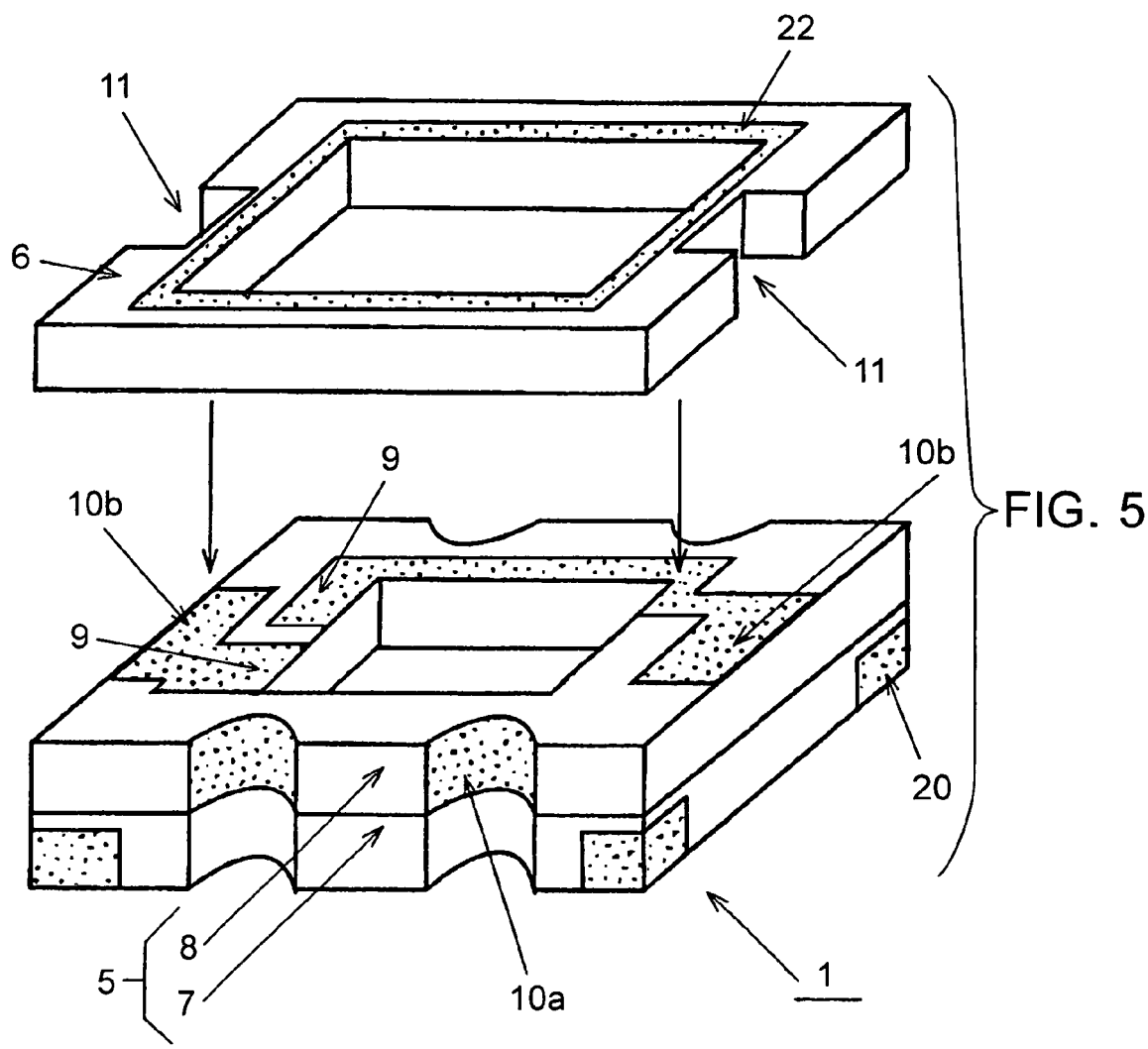
FIG. 5 is an exploded perspective view illustrating a surface mount crystal oscillator according to a further embodiment of the present invention.

FIG. 4 is a perspective view illustrating another structure of crystal blank 3. Crystal blank 3 illustrated in FIG. 4 is substantially rectangular in shape, and is formed with excitation electrodes 23 in central regions of both main surfaces. From a pair of excitation electrodes 23, extending electrodes 24 are extended, respectively, toward both ends of one shorter side of crystal blank 3, and the leading end of each extending electrode 24 is folded over along the short side onto the opposite main surface crystal blank 3. For using crystal blank 3 formed with one pair of extending electrodes 24 on both ends of one side as described above, crystal terminals 9 must be formed at different positions in the crystal oscillator illustrated in FIGS. 2A and 2B. In this event, as illustrated in FIG. 5, a pair of crystal terminals 9 are formed along one side of the opening formed through second frame wall 8, such that one of crystal terminal 9 is integrated with testing crystal terminal 10b formed at one end in the longitudinal direction of package body 1 as it is, while the other crystal terminal 9 is connected to testing crystal terminal 10b formed at the other end in the longitudinal direction of package body 1 through conductive path 19 formed along the edge of the opening in second frame wall 8. Even in crystal oscillator illustrated in FIGS. 3A to 3C, when it uses a crystal blank which has extending electrodes formed on both ends of one side, a pair of crystal terminals 9 may be formed at different positions, and conductive paths 19 may be changed in pattern for connecting crystal terminals 9 to testing crystal terminals 10b.

While in the foregoing description, the testing crystal terminals are designed to expose in upward orientation, the testing crystal terminals may be disposed on the outer side surface of the package body, and write terminals may be exposed in upward orientation.

When the IC chip and crystal blank are disposed on the same plane in the horizontal direction, the recess of the package body need not be provided with a step, so that the second frame wall is eliminated from the bottom wall. In this structure, crystal terminals may be disposed on the flat plate of the bottom plate, and testing crystal terminals may be extended from the crystal terminals toward the outer periphery of the flat plate.

What is claimed is:

1. A crystal oscillator comprising:
   a package body having a bottom wall and a first frame wall laminated on said bottom wall, said first frame wall having a central opening;
   a crystal unit accommodated in a recess formed in said package body including said central opening;
   an IC chip accommodated in said recess and having at least an oscillator circuit connected to said crystal blank; and
   a cover for enclosing said recess to hermetically encapsulate said crystal blank and said IC chip within said recess;
   wherein a notch portion is partially cut into an outer periphery of said first frame wall, and a terminal formed on a portion of a top of said bottom wall is exposed in said notch portion; and
   wherein said terminal comprises a pair of testing terminals, and said crystal oscillator further comprises a pair of crystal terminals disposed on the top of said bottom wall such that said crystal blank is bonded thereto, said crystal terminals extending to an outer periphery of said bottom wall to provide said testing crystal terminals.

2. The crystal oscillator according to claim 1, wherein said bottom wall includes a flat plate, and a second frame wall laminated on said flat plate and having a central opening, said crystal terminals and said testing crystal terminals being formed on a top of said second frame wall.

3. The crystal oscillator according to claim 1, wherein said package body has a substantially rectangular planar shape, and said pair of testing crystal terminals are disposed substantially at center of respective sides of said package body in a longitudinal direction.

4. The crystal oscillator according to claim 2, wherein said package body has a substantially rectangular planar shape, and said pair of testing crystal terminals are disposed substantially at center of respective sides of said package body in a longitudinal direction.

5. The crystal oscillator according to claim 1, wherein said package body has a substantially rectangular planar shape, and said pair of testing crystal terminals are disposed substantially at center of respective sides of said package body in a width direction.

6. The crystal oscillator according to claim 2, wherein said package body has a substantially rectangular planar shape, and said pair of testing crystal terminals are disposed substantially at center of respective sides of said package body in a width direction.

7. The crystal oscillator according to claim 4, wherein said central opening of said second frame wall is substantially rectangular, and said crystal terminals are formed corresponding to substantially center of a pair of opposing sides of said central opening formed through said second frame wall.

8. The crystal oscillator according to claim 6, wherein said central opening of said second frame wall is substantially rectangular, and said crystal terminals are formed corresponding to substantially center of a pair of opposing sides of said central opening formed through said second frame wall.

9. The crystal oscillator according to claim 4, wherein said central opening of said package body is substantially rectangular, and said crystal terminals are formed corresponding to both ends of one side of said central opening formed through said frame wall.

10. The crystal oscillator according to claim 9, wherein said crystal blank includes a pair of excitation electrodes formed on both main surfaces thereof, and a pair of extending electrodes extending from said excitation electrodes to both ends of one side of said crystal blank.

11. The crystal oscillator according to claim 1, wherein said IC chip includes a temperature compensation mechanism, and said crystal oscillator further comprises a write terminal on an outer surface of said package body for use in writing compensation data for said temperature compensation mechanism.

* * * * *